United States Patent [19]

Samson

[11] Patent Number: 4,638,406
[45] Date of Patent: Jan. 20, 1987

[54] DISCRETE COMPONENT MOUNTING ASSEMBLY

[75] Inventor: Robert Samson, Tempe, Ariz.

[73] Assignee: Motorola, Inc., Schaumburg, Ill.

[21] Appl. No.: 854,680

[22] Filed: Apr. 14, 1986

Related U.S. Application Data

[63] Continuation of Ser. No. 657,639, Oct. 4, 1984, abandoned.

[51] Int. Cl.[4] .............................................. H05K 1/18
[52] U.S. Cl. .............................. 361/403; 174/52 FP; 174/138 G; 339/17 CF; 361/396; 361/400; 361/404
[58] Field of Search ...................... 174/138 G, 52 FP; 361/395, 400, 403, 404; 339/17 CF

[56] References Cited

U.S. PATENT DOCUMENTS

| | | | |
|---|---|---|---|
| 2,913,634 | 11/1959 | Scoville | 361/404 X |
| 2,999,994 | 9/1961 | Bours et al. | 174/138 G |
| 3,409,857 | 11/1968 | Oneill et al. | 361/403 X |
| 3,447,040 | 5/1969 | Denton, Jr. | 339/17 CF |
| 3,483,308 | 12/1969 | Wakely | 361/403 X |
| 4,054,742 | 10/1977 | Bonhomme | 174/68.5 |
| 4,089,041 | 5/1978 | Lockard | 174/52 FP X |
| 4,163,598 | 8/1979 | Bianchi et al. | 339/18 B X |
| 4,361,862 | 11/1982 | Martyniak | 361/401 X |
| 4,376,560 | 3/1983 | Olsson et al. | 339/17 CF |
| 4,558,397 | 12/1985 | Olsson | 174/52 FP |

FOREIGN PATENT DOCUMENTS 2091036  7/1982  United Kingdom ........... 174/52 FP

Primary Examiner—R. R. Kucia
Attorney, Agent, or Firm—Eugene A. Parsons

[57] ABSTRACT

A base member having two end portions with v shaped notches formed in the upper surface thereof to receive the leads of discrete components. The notches have trough shaped contacts affixed therein, which contacts have a portion extending to a lower surface of the base member to form a contact pad for soldering to a printed wiring board or the like.

9 Claims, 3 Drawing Figures

DISCRETE COMPONENT MOUNTING ASSEMBLY

This application is a continuation of application Ser. No. 657,639, filed 10/04/84, now abandoned.

BACKGROUND OF THE INVENTION

In the prior art, the attachment of discrete components to printed wiring boards requires a rather precise bending of discrete component leads so that they can be automatically, or manually, inserted into printed-through holes in the printed wiring board. For this type of mounting, the printed-through holes must be relatively large. Also, it is difficult to control the amount of lead which extends through the reverse side of the board and, therefore, there are generally soldered leads extending outwardly from the reverse side of the board. Because of these problems, discrete components can generally be mounted only on one side of a printed wiring board which greatly reduces the density of components.

SUMMARY OF THE INVENTION

The present invention pertains to a discrete component mounting assembly including a base member having discrete component lead receiving notches formed in opposed ends thereof with a generally trough shaped contact fixedly engaged in each of the notches and having a portion extending to a common surface to form a connecting pad, discrete components being positioned in the base member with the leads fixedly engaged in the notches by means of a high temperature solder or the like, and the base member being affixed to one side of a printed circuit board with the contact pads electrically connected to pads on the printed circuit board.

It is an object of the present invention to provide a new and improved discrete component mounting assembly.

It is a further object of the present invention to provide a new and improved discrete component mounting assembly for attaching discrete components to a printed wiring board without requiring plated-through holes.

It is a further object of the present invention to provide a new and improved discrete component mounting assembly which will permit two-sided component mounting on printed wiring boards.

It is a further object of the present invention to provide a new and improved discrete component mounting assembly which allows via holes in printed wiring boards to be reduced in diameter and, thereby, permits more working area on the board.

These and other objects of this invention will become apparent to those skilled in the art upon consideration of the accompanying specification, drawings and claims.

BRIEF DESCRIPTION OF THE DRAWINGS

Referring to the drawings.

DESCRIPTION OF THE PREFERRED EMBODIMENT

Figures 1, 2:
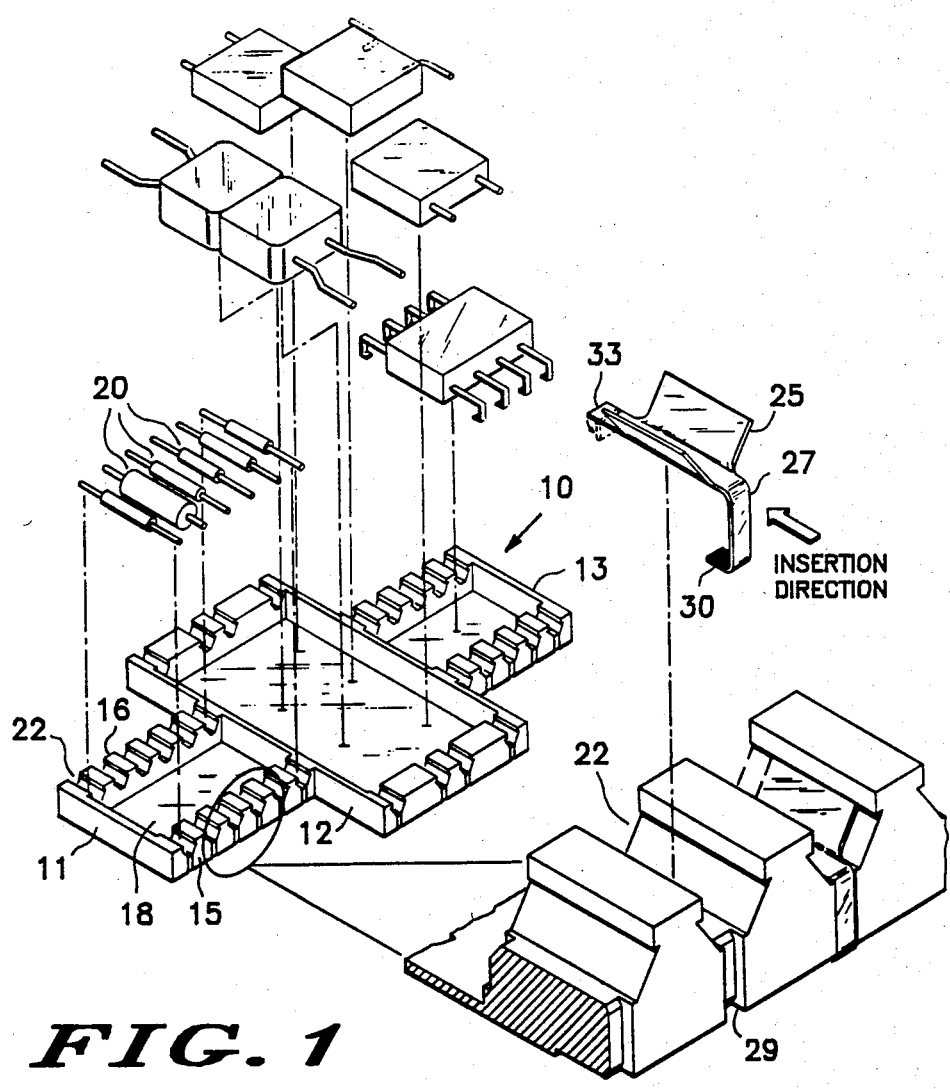
FIG. 1 is an exploded view in perspective of a discrete component mounting assembly embodying the present invention.
FIG. 2 is an enlarged exploded view of a portion of the assembly illustrated in FIG. 1.

Referring specifically to FIG. 1 and FIG. 2, a base member generally designated 10 is illustrated. Base member 10 includes three sections 11, 12 and 13, all of which are formed integrally in this embodiment. Section 12 is formed in the center of base member 10 with sections 11 and 13 extending outwardly from either side thereof and formed generally as mirror images of each other. Since each of the sections are basically similar, only section 11 will be described in detail herein.

Section 11 is formed with two spaced apart end portions 15 and 16 with the surface 18 of the area therebetween being lower to receive the bodies of discrete components 20. The end portions 15 and 16 have a plurality of notches 22 formed in the upper surface thereof. Notches 22 are formed with the upper opening being somewhat wider than the lower extremity of the notch, which will be referred to herein as a generally v shaped cross section. While the notches 22 in end portions 15 and 16 may be formed in any convenient pattern to receive specific desired discrete components, the notches in section 11 are formed so that each notch in end 15 has an opposed notch in end 16 lying substantially along a common axis. With this specific embodiment discrete components, such as resistors and the like having leads extending axially from either end thereof, will be readily received in a pair of opposed notches 22.

Referring specifically to FIG. 2, notches 22 can be seen in more detail. Each of the notches 22 is undercut along the upper edges thereof to form a contact stop on each side of the notch 22. A generally trough shaped contact 25 is formed to be inserted axially, or horizontally, into each of the notches 22. With contact 25 inserted into notch 22 the upper edges of contact 25 engage the undercut area of notch 22 to prevent withdrawal of contact 25 in a transverse direction. At one end of the trough shaped portion of contact 25 a portion 27 extends generally outwardly and downwardly in a u-shaped configuration. The portion 27 is adapted to fit in a slot 29 in the end portion 15 of section 11 and to extend under section 11 to form an external electrical connection, or contact pad 30. With portion 27 engaged in slot 29 further insertion of contact 25 into notch 22 is prevented. A tab 33 at the opposite end of the trough shaped portion of contact 25 can be bent downward into a clinched position, (illustrated in dotted lines in FIG. 2) to maintain contact 25 fixedly postioned in notch 22. It will of course be understood that contact 25 is formed so as to provide the simplest and least expensive method of fixedly engaging the contacts in each of the notches 22. However, it will be understood by those skilled in the art that many other configurations of contact 25 and notch 22 might be devised by those skilled in the art.

In the present embodiment base member 10 is injection molded with a thermoset material which is compatable with the temperature coefficient of the printed wiring boards on which it is to be mounted. The notches 22 in end walls 15 and 16 are molded laterally so that preformed contacts 25 can be inserted and locked into position by clinch tabs 33. The contacts 25 are preformed from some relatively stiff electrically conducting material, such as berilium copper (BeCu). In the case of small components having axial leads, such as that for section 11, the spacing between notches 22 is approximately 0.100 inch centers. The dimensions for the special components in section 12 are spaced farther apart and are configured especially for these compoents. If the vertical dimension of the end walls of any section is increased to accommodate larger components, the portion 27 of contact 25 can be increased and the contact can be preformed with a longer vertical portion to fit the increased size of the walls. Similarly end walls with shorter vertical dimensions can be accommodated by reducing the size of section 27. In the production of mounting assemblies each section can be supplied with a full complement of contacts 25, which contacts can be removed selectively, if they are not needed. Also, unused contacts 25 can remain in place, improving the overall retention force of the carrier to the printed wiring board. The contacts 25 are formed from 0.005 inch thick BeCu, tin plated or gold plated. Contacts 25 can easily be stamped and formed from a continuous strip, on a progressive dye. It will of course be understood by those skilled in the art that other configurations of contact 25 might be utilized if desired.

The bottom of base member 10 can be a solid floor or the areas 18 can be void of material if desired. In instances where the components require additional bonding strength the bottom of the base member can be formed as a solid floor and the entire structure can be bonded to the surface of a printed wiring board. The environmental conditions for the equipment will determine the necessity, as well as the kind, of adhesive to be utilized. Solder preforms may be attached to each components leads (or added after the components are in place). The mounting assembly can then readily be belt fed into an IR oven for batch soldering. After cooldown, the assembly can be automatically tested for proper component location, component values, diode and capacitor polarity, etc., prior to surface mounting on a printed wiring board by reflow or vapor solder techniques. The component leads should be soldered to the contact 25 using a high temperature solder. The use of solder preforms and batch soldering methods is recommended to perform this function. Vapor phase, IR oven, and localized reflow methods can be used. The use of high temperaure solder is recommended to avoid secondary reflow when the assembly is ultimately attached to the surface of a printed wiring board in subsequent assembly operations.

Figure 3:
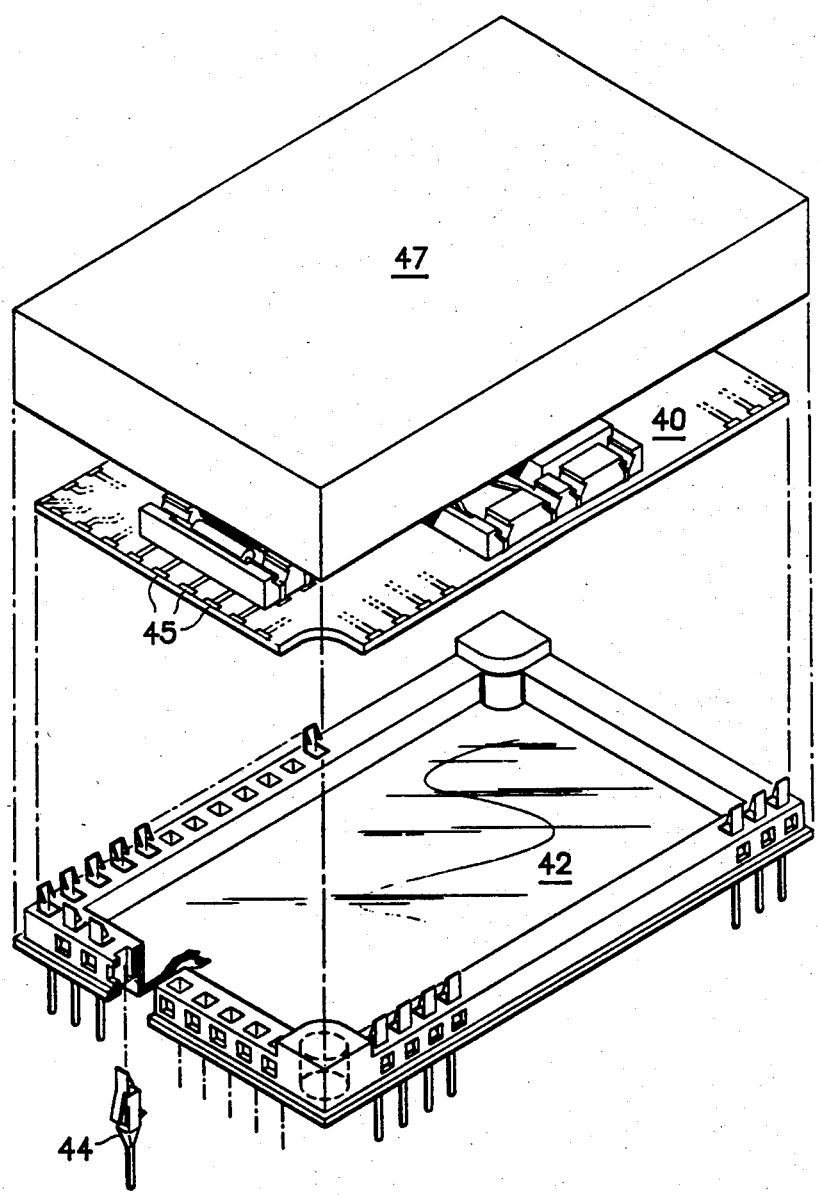
FIG. 3 is an exploded view in perspective of the assembly of FIG. 1 mounted on a printed wiring board within a plug-in unit.

Referring to FIG. 3, the base member 10 with components soldered therein is illustrated attached to the surface of a printed wiring board 40. Printed wiring board 40 is adapted to be engaged in a header 42 by means of a plurality of external spring contacts 44. Spring contacts 44 engage external contact pads 45 on printed wiring board 40 and hold the printed wiring board 40 fixedly engaged with header 42. Also, spring contacts 44 provide an external pin contact for plugging the finished assembly into a mating socket. A cover 47 is adapted to be placed over the entire assembly for sealing the assembly and identification purposes. It will of course be understood that the structure illustrated in FIG. 3 is only one embodiment and many other assemblies may be devised by those skilled in the art.

Thus, a discrete component mounting assembly is illustrated including preformed contacts which allow a soldered connection of component leads to uniformly spaced contacts which can be soldered to a corresponding pad on the outer surface of a printed wiring board. The base member of the assembly allows for imprecise insertion of the discrete components into v shaped notches at the top of the contact, whereas the foot of the contact will be precisely located and dimensioned along the bottom of the base member. The discrete component mounting assembly is used if surface mounting to both sides of a printed wiring board is desired. Because the base member holds the discrete components tightly to the printed wiring board and provides an electrical contact without requiring plated-through holes, plated-through holes are eliminated, which practically doubles the effect land area for component mounting. Further, the base member provides strength of retention, ease of assembly and test, and a single element for handling a multiplicity of dissimilar components.

While I have shown and described a specific embodiment of this invention further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A discrete component mounting assembly comprising:
    a base member formed of electrically insulating material with first and second spaced apart end portions;
    each of said first and second end portions having elongated notches formed therein with a generally v shaped cross section for receiving component leads therein;
    a generally trough shaped contact, formed of electrically conductive material, fixedly positioned in each of said notches and including a portion extending beyond the notch for external electrical connection; and
    said base member further including a relatively flat mounting surface and the extending portion of each trough shaped contact extending into a partial overlying position with said flat surface to form a connecting pad.

2. A discrete component mounting assembly as claimed in claim 1 wherein notches formed in the first end lie in opposed relationship to notches formed in the second end with opposed notches lying substantially along common axes.

3. A discrete component mounting assembly as claimed in claim 1 wherein each notch includes contact retaining undercuts in each opposed surface thereof for engaging the edges of the trough shaped contact positioned therein and preventing transverse separation thereof.

4. A discrete component mounting assembly as claimed in claim 3 wherein each trough shaped contact includes a base gripping tab at each end thereof to present axial movement within the notch.

5. A discrete component mounting assembly as claimed in claim 4 wherein the base member is molded from thermoset plastic.

6. A discrete component mounting assembly as claimed in claim 1 including in addition a component having leads positioned in two trough shaped contacts and fixed therein with high temperature solder.

7. A discrete component mounting assembly as claimed in claim 6 including a printed wiring board affixed to the portion of each trough shaped contact extending beyond the notch.

8. A discrete component mounting assembly as claimed in claim 7 wherein the portions of the contacts are affixed to the printed wiring board by a lower temperature solder than the solder affixing the component to the contacts.

9. A discrete component mounting assembly comprising:
- a base member formed of plastic and including a pair of spaced apart, generally parallel end portions having an upper surface and a lower mounting surface;
- each of said end portions having elongated notches formed in the upper surface thereof with a generally v shaped cross section and opposed notches lying substantially along a common axis;
- a generally trough shaped contact, formed of electrically conductive material, fixedly positioned in each of said notches and including a portion extending to the lower mounting surface of said end portions to form an electrical connecting pad.

* * * * *